United States Patent
Berchin (10) Patent No.: US 11,218,190 B2
(45) Date of Patent: Jan. 4, 2022

(54) SYNTHETIC ANALOG-TO-DIGITAL CONVERTER (ADC) FOR LEGACY TWACS METERS

(71) Applicant: Aclara Meters LLC, St. Louis, MO (US)

(72) Inventor: Gregory Berchin, St. Charles, MO (US)

(73) Assignee: Aclara Meters LLC, St. Louis, MO (US)

( * ) Notice: Subject to any disclaimer, the term of this patent is extended or adjusted under 35 U.S.C. 154(b) by 0 days.

(21) Appl. No.: 17/072,727

(22) Filed: Oct. 16, 2020

(65) Prior Publication Data
US 2021/0036737 A1 Feb. 4, 2021

Related U.S. Application Data

(63) Continuation of application No. 16/388,972, filed on Apr. 19, 2019, now Pat. No. 10,812,141.

(60) Provisional application No. 62/659,811, filed on Apr. 19, 2018.

(51) Int. Cl.
*H04B 3/54* (2006.01)
*H03M 1/12* (2006.01)

(52) U.S. Cl.
CPC ............ *H04B 3/542* (2013.01); *H03M 1/129* (2013.01); *H04B 2203/542* (2013.01); *H04B 2203/5491* (2013.01)

(58) Field of Classification Search
CPC .............. H04B 2203/542; H04B 3/542; H04B 2203/5433; H04B 2203/5491; H04B 1/0475; H03M 1/129; H04L 25/03343; H04L 25/085
See application file for complete search history.

(56) References Cited

U.S. PATENT DOCUMENTS

| | | |
|---|---|---|
| 2,997,704 A | 8/1961 | Gordon et al. |
| 3,108,266 A | 10/1963 | Gordon et al. |
| 3,594,584 A | 7/1971 | Woods |
| 4,254,403 A | 3/1981 | Perez-Cavero et al. |

(Continued)

OTHER PUBLICATIONS

W.M. Goodall; Telephony by Pulse Code Modulation; The Bell System Technical Journal, vol. XXVI, No. 3 Jul. 1947, pp. 395-509.

*Primary Examiner* — Sung S Ahn
(74) *Attorney, Agent, or Firm* — Michael Best & Friedrich LLP (57) ABSTRACT

An electrical meter (M) installed at a facility (F) supplied electrical power by a utility's (U) electrical distribution system (EDS) utilizes a two-way automatic communications system (TWACS) for receiving messages from the utility sent over the electrical distribution system using the TWACS. An improvement to the meter comprises reconfiguring existing components installed in the meter to function as an analog-to-digital (ADC) converter so to facilitate processing of powerline waveforms (WF) propagated through the electrical distribution system by application of a signal based detection algorithm. This improves detection of signal elements comprising a message sent via the TWACS and by other means and incorporated in the electrical waveforms thereby reducing occurrence of a false synchronization with the message elements so a content of a message is readily ascertained by the meter.

20 Claims, 4 Drawing Sheets

(56) References Cited

U.S. PATENT DOCUMENTS

| | | | |
|---|---|---|---|
| 4,658,238 A | | 4/1987 | Mak |
| 4,914,418 A | | 4/1990 | Mak et al. |
| 5,198,769 A | * | 3/1993 | Frese .................. G01R 33/385 |
| | | | 324/318 |
| 5,198,796 A | | 3/1993 | Hessling, Jr. |
| 6,278,357 B1 | | 8/2001 | Croushore et al. |
| 8,928,170 B2 | | 1/2015 | Rieken |
| 10,812,141 B2 | * | 10/2020 | Berchin ................. H04B 3/542 |
| 2007/0057773 A1 | * | 3/2007 | Hsieh ....................... H04B 5/02 |
| | | | 340/10.41 |
| 2012/0039400 A1 | * | 2/2012 | Rieken ................... H04L 7/042 |
| | | | 375/257 |

\* cited by examiner

SYNTHETIC ANALOG-TO-DIGITAL CONVERTER (ADC) FOR LEGACY TWACS METERS

REFERENCE TO RELATED APPLICATIONS

This application is a continuation of U.S. patent application Ser. No. 16/388,972, filed Apr. 19, 2019, which claims the benefit of U.S. provisional patent application 62/659,811 filed Apr. 19, 2018, and the contents of both are incorporated herein by reference.

BACKGROUND OF THE INVENTION

The invention relates to electrical meters installed at facilities provided electrical power by a utility through an electrical distribution system; and, in particular, to an upgrading of older "legacy" meters used in such systems in which communications between the utility and facility is accomplished using a two-way automatic communications system, or TWACS®.

In a TWACS, messages transmitted between a utility and a using facility comprise signal elements which are incorporated in the electrical waveforms propagated through the distribution system. The signal elements are detected at threshold-crossing points in the waveform and are processed to determine the contents of a message. Over time, as electrical meters have developed and been improved, new electronic components and software have been incorporated into the meters to improve message synchronization and the reliability of element detection. One of these improvements has been the incorporation of an analog-to-digital converter (ADC), which facilitates use of more sophisticated signal-based TWACS detectors that employ features such as matched-filtering, spectral analysis, as well as others techniques known in the art.

Older, legacy electric meters do not have an analog-to-digital converter (ADC), the lack of which means that actual powerline waveforms cannot be observed by the meter. Rather, legacy meters instead detect TWACS signals by use of a threshold-crossing algorithm in which a threshold level is set by a digital-to-analog converter (DAC) installed in the meter and controlled by a microprocessor also installed in the meter. The crossing of the threshold by a powerline voltage waveform is detected by a level comparator circuit within the meter, with the time at which the threshold is crossed being observed by the microprocessor relative to a clock within the unit. In effect, the presence of TWACS signals is determined indirectly; i.e., by means of heuristics applied to the observed elapsed time between crossings of various levels.

BRIEF SUMMARY OF THE INVENTION

This present invention is an improvement to electrical meters and involves reconfiguring the existing microprocessor, DAC, comparator, clock, and ancillary circuitry within a legacy TWACS meter to function as a "rudimentary" ADC by which powerline waveforms can now be directly observed. Doing so enables the application of sophisticated signal-based detection algorithms thereby improving reliability in detecting TWACS and other signals and reducing the probability of false synchronizations. Accordingly, these waveforms are observed with sufficient fidelity for TWACS detection. Implementation of the invention requires firmware changes but no hardware changes. The firmware changes for accomplishing meter reconfiguration are downloaded to legacy meters using conventional TWACS messaging techniques.

The ability to reconfigure legacy TWACS meters in accordance with the invention has the important advantage of a utility not having to incur the cost of replacing these meters while insuring the legacy meters can reliably detect and process TWACS communications transmitted through an electrical distribution system of the utility.

Other objects and features will be in part apparent and in part pointed out hereinafter.

BRIEF DESCRIPTION OF THE SEVERAL VIEWS OF THE DRAWINGS

The objects of the invention are achieved as set forth in the illustrative embodiments shown in the drawings which form a part of the specification.

DETAILED DESCRIPTION OF THE INVENTION

The following detailed description illustrates the invention by way of example and not by way of limitation. This description clearly enables one skilled in the art to make and use the invention, and describes several embodiments, adaptations, variations, alternatives and uses of the invention, including what is presently believed to be the best mode of carrying out the invention. Additionally, it is to be understood that the invention is not limited in its application to the details of construction and the arrangement of components set forth in the following description or illustrated in the drawings. The invention is capable of other embodiments and of being practiced or carried out in various ways. Also, it will be understood that the phraseology and terminology used herein is for the purpose of description and should not be regarded as limiting.

Figure 1:
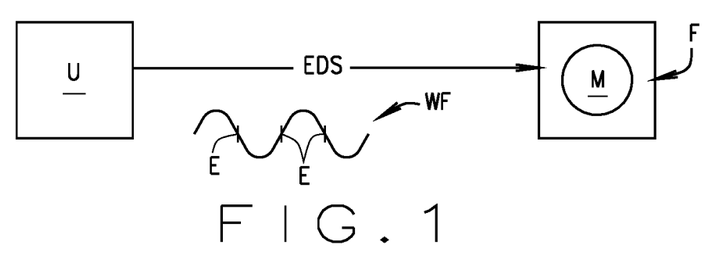
FIG. 1 is a simplified representation of a utility's electrical distribution system with a meter installed at a user's facility.

Referring to FIG. 1, a utility U provides electrical power to a user's facility F through an electrical distribution system EDS. An electric meter M installed at the facility measures the amount of electricity used at the facility. As is known in the art, meter M may also be a TWACS meter used for processing messages transmitted between utility U and facility F. As noted above, a TWACS message is of comprised signal elements E incorporated in electrical waveforms WF propagated through electrical distribution system EDS. These waveforms are substantially sinusoidal waveforms, as shown in FIG. 1, with the TWACS signal elements E imposed on the propagated waveform near zero-crossing points of the waveform. Previously, in "legacy" TWACS meters, these signal elements E were detected at zero-crossing points in waveform WF with the detected signal elements then being processed to determine the contents of the TWACS message.

Figure 2:
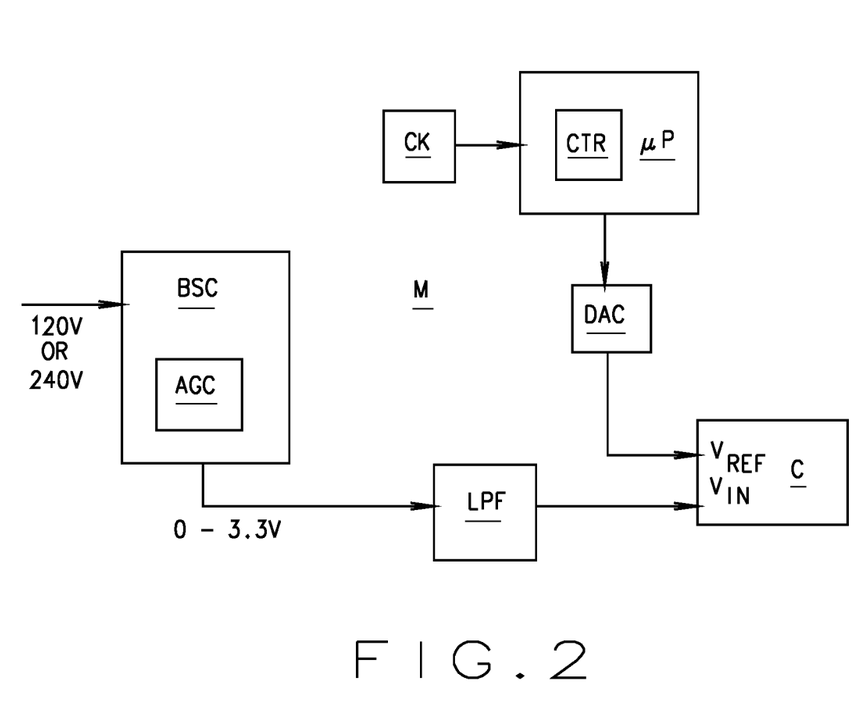
FIG. 2 is a block diagram of signal detection circuitry in a legacy TWACS meter.

Referring to FIG. 2, legacy meters M include automatic gain control AGC circuitry incorporated within a buffer and signal conditioning module BSC of the meter. The AGC ensures that peak positive and negative extremes of the powerline waveform WF, as produced at the output of a lowpass filter LPF, fall strictly within a range compatible with an output from a digital-to-analog converter DAC. The lowpass filter supplies, as an output, a voltage to a Vin input of a comparator C.

A microprocessor μP supplies, as an output, a digital word whose contents correspond to a desired voltage level, the crossing of which is to be observed. This digital word is converted in the DAC to a voltage level applied to a Vref input of comparator C. If the powerline voltage representation at the Vin input to comparator C is less than the desired voltage level the Vref input of the comparator, then the output of the comparator is a logic "zero". However, if the powerline voltage at input Vin is greater than the desired voltage level at input Vref, then the comparator output is a logic "one". Accordingly, the crossing of the waveform from "less than the desired voltage" to "greater than the desired voltage" is detected by observation of the output of comparator C transitioning from "zero" to "one", and vice-versa.

Within the microprocessor is a counter CTR whose count value increments in response to pulses received from a clock CK. By comparing the counter values of counter CTR between various threshold crossings, microprocessor μP determines the elapsed time between threshold crossings, and various heuristic algorithms are applied to this elapsed time value between the crossings to detect the presence of TWACS signals.

The improvement of the present invention requires no changes to the hardware described above, only firmware changes which alter the manner in which the hardware is utilized. Those skilled in the art will understand that the firmware changes for accomplishing meter reconfiguration are downloaded to TWACS legacy meters using conventional TWACS messaging techniques. This ability to reconfigure legacy TWACS meters M currently installed at facilities F has the important advantage of allowing utility U to not have to incur the cost of replacing these meters while insuring the meters can reliably detect and process TWACS communications.

In accordance with the invention, the AGC circuitry within meter M operates without modification to ensure that the peak positive and negative extremes of the powerline waveform representation at the output of the filter LPF fall within a range compatible with the DAC. The DAC is now configured such that its output range spans somewhat less than the extremes of the filter's output. That is, the output from the DAC, when its input is a digital "minimum value", is a value dependent upon a numerical representation utilized by the DAC and is somewhat greater than the filter's output when the powerline waveform is at its negative peak. And, the output from the DAC, when its input is a digital "maximum value", is also a value dependent upon the numerical representation utilized by the DAC and is somewhat less than filter LPFs output when the powerline waveform is at its positive peak.

The configuration of meter M of the present invention depends significantly upon the frequency of clock CK, the speed of microprocessor μP, the settling time of the DAC, and the response time of comparator C.

In one embodiment of the invention, an ideal case where the performances of the clock, microprocessor, the DAC, and comparator are all sufficiently high, microprocessor μP and the DAC combine to perform a successive-approximation implementation, such as is well-known in the art. At the start of a conversion process, microprocessor μP sends a digital value of "one-half of full-scale" to the DAC; which, in turn, sends a corresponding "half-scale" analog output to the "Vref" input of comparator C. At the next cycle of clock CK, microprocessor μP examines the value of the output from comparator C. If this output is a logic "one", indicating that "Vin>Vref", then the microprocessor adjusts the value of the digital word sent to the DAC upwardly by "one-quarter of full-scale". Conversely, if the comparator output is a logic "zero", indicating that "Vin<Vref", then microprocessor μP adjusts the value of the digital word sent to the DAC downward by "one-quarter of full-scale". In addition, the value of the most significant bit (MSB) of a digital register (not shown) within the microprocessor is set to the value of the comparator's output.

This process is repeated, each time reducing the adjustment to the digital word sent to the DAC to one-half the previous adjustment, and each time setting one more bit in the microprocessor's digital register, working sequentially from the MSB toward the least significant bit (LSB) until there are no more bits in the digital word sent to the DAC left to adjust. The final value of the microprocessor's digital register is now the digital value of a rudimentary ADC that comprises the present invention. Microprocessor μP also records the counter value at the time the above described process is completed.

Now, the process starts over again, ideally constrained such that the time between conversions is substantially constant. The output of this process is a plurality of "level versus counter value" pairs. The counter values are analogous to time, so the pairs represent "level versus time". The overall result of the process described above is implementation of a successive approximation ADC, similar to those well-known in the art, but applied in a novel fashion to the unique circumstances within a legacy TWACS meter.

In a legacy TWACS meter, one or more of the clock's, microprocessor's, DACs, or comparator's performance may be insufficient to allow implementation of the process described above. For example, the settling time of the DAC may be as high as 10 μsec, the frequency of the clock as low as 500 kHz, and performance of the microprocessor as slow as 1 million operations per second (MIPS). Under these circumstances, each adjustment by microprocessor μP to the DAC will require several microseconds (μsec) for execution of the algorithm within the microprocessor, 2 μsec for the pulse from clock CK, plus 10 μsec for the settling time of the DAC. In a TWACS meter M, the DAC generally supports 8-bit inputs, or 8 successive approximation steps; so, even without accounting for the unknown execution time within the microprocessor, each analog-to-digital conversion would require at least 96 μsec. This results in a "best-case" maximum sampling frequency of slightly more than 10 kHz; again, without accounting for the microprocessor's execution time.

For those instances in which the successive approximation process described above cannot be readily implemented, a second embodiment of the invention involves an alternate rudimentary ADC implementation as described below.

In this second embodiment, at startup, microprocessor μP selects a starting value for its digital word output. Typically, but not necessarily, this is a digital "minimum value". This value is sent to the DAC, which sets its output value accordingly and sends this output value to the Vref input of comparator C. If the output of the comparator is a logic "zero", indicating that the powerline waveform representation is less than the DAC output, microprocessor μP waits until the powerline waveform representation exceeds the DAC output value, at which time the output of comparator C transitions to logic "one". The microprocessor then records the counter value at the time of transition, increments the value of the digital word it sends to the DAC, and waits for the next transition of the comparator's output from a logic "zero" to a logic "one".

Conversely, if the initial output of comparator C is a logic "one", indicating the powerline waveform representation is greater than the output of the DAC, then microprocessor μP repeatedly increments the value of the digital word it sends to the DAC until such time as the output of the DAC becomes greater than the powerline waveform representation, and the output of comparator C becomes a logic "zero". Microprocessor μP then waits until the output of comparator C transitions to a logic "one", at which time the process proceeds as described above.

This sequence is followed until such time as the word sent by the microprocessor is at a digital "maximum value" and the powerline waveform representation crosses the associated threshold. Now, the powerline waveform representation is near its maximum value and the DAC output is also at its maximum value. The procedure is then reversed with microprocessor μP waiting for the output from comparator C to transition from a logic "one" to a logic "zero", at which point the counter value at the time of transition is recorded and the value of the digital word sent to the DAC is decremented. The microprocessor then waits for the output from the comparator to now transition from a logic "one" to a logic "zero". At this point, the counter value at the time of the transition is recorded, the value of the digital word sent to the DAC is decremented; and so forth, until the digital word sent to the DAC is at its digital "minimum value". The procedure then reverses direction yet again.

The result of this process is a plurality of "counter value at which level was crossed versus level" pairs. These counter values are analogous to time; so, in effect, the pairs represent "time versus level". This is a duality of the function of typical prior art ADCs, whose output is "level versus time". The present invention converts "time versus level" into "level versus time" by use of a mathematical interpolation. The result is a traditional "level versus time" waveform to which standard signal-based analysis techniques may be applied.

The procedure described above constrains the "time versus level" pairs such that the level values are always either monotonically increasing or monotonically decreasing. If the actual powerline waveform exhibits a behavior that is not monotonically increasing or decreasing, then any such regions of non-monotonic behavior will not be characterized. Once the powerline waveform returns to a monotonic behavior, the procedure will resume proper characterization of the waveform.

For the legacy meter M employed in both described embodiments, the meter configuration is as shown in FIG. 2. Here, the clock frequency is 1 MHz, and the DAC output is 8 bits. The lowpass filter LPF's cutoff frequency is 1200 Hz; so, the majority of TWACS waveform activity is expected to occur below that frequency.

The preferred embodiment is one in which all components exhibit sufficient performance to support the necessary timing requirements with the result being approximately equivalent to a prior art successive-approximation ADC of the same number of bits as exist at the input to the DAC, with commensurate ADC performance.

Figure 3:
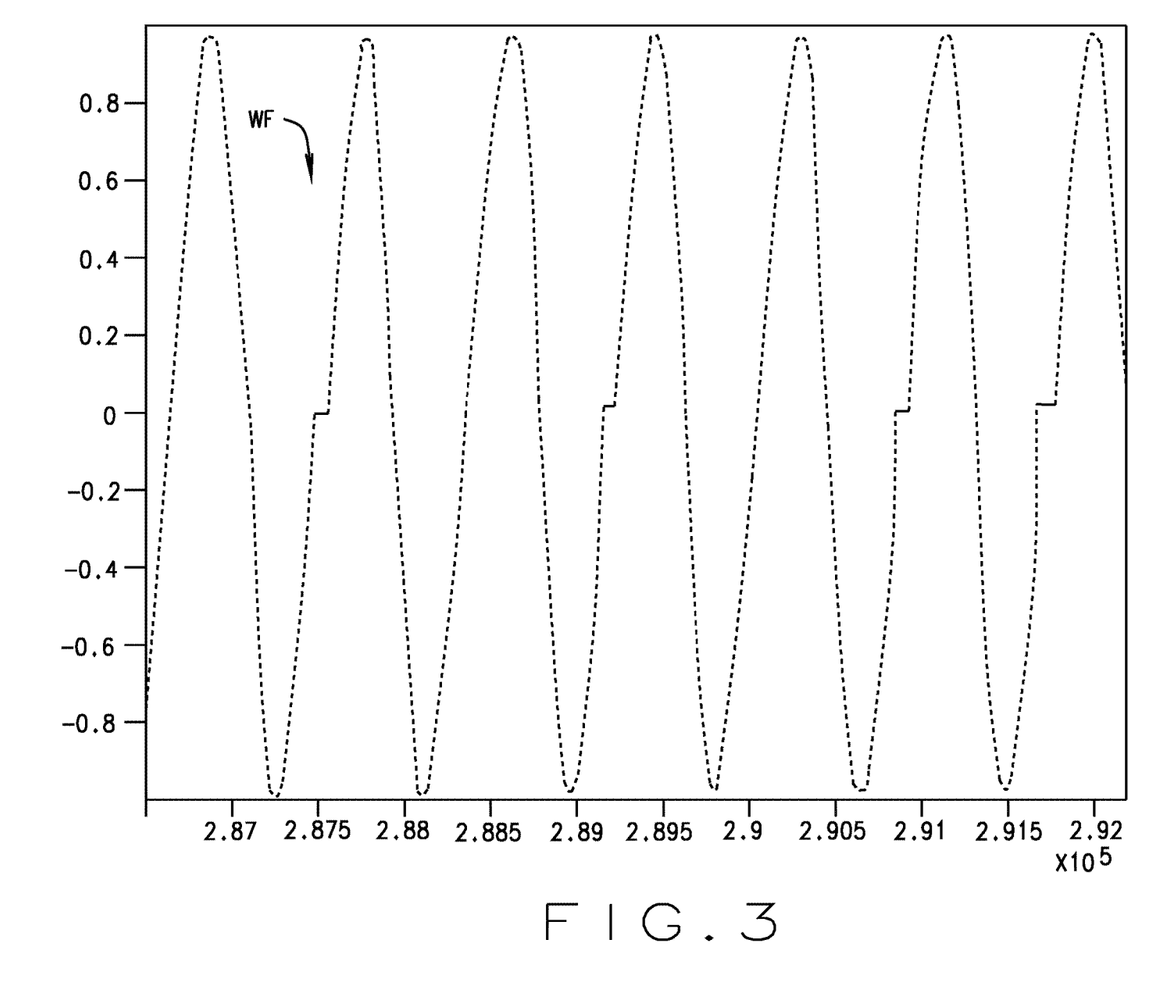
FIG. 3 is a representation of an electrical waveform propagated through a utility's electrical distribution network with TWACS message elements occurring at zero-crossings of the waveform; and, FIGS. 4 and 5 represent various TWACS signal reconstructions vs. a measured powerline signal, the waveforms shown in these FIGS. not having been passed through a lowpass filter of a meter.
Figure 4:
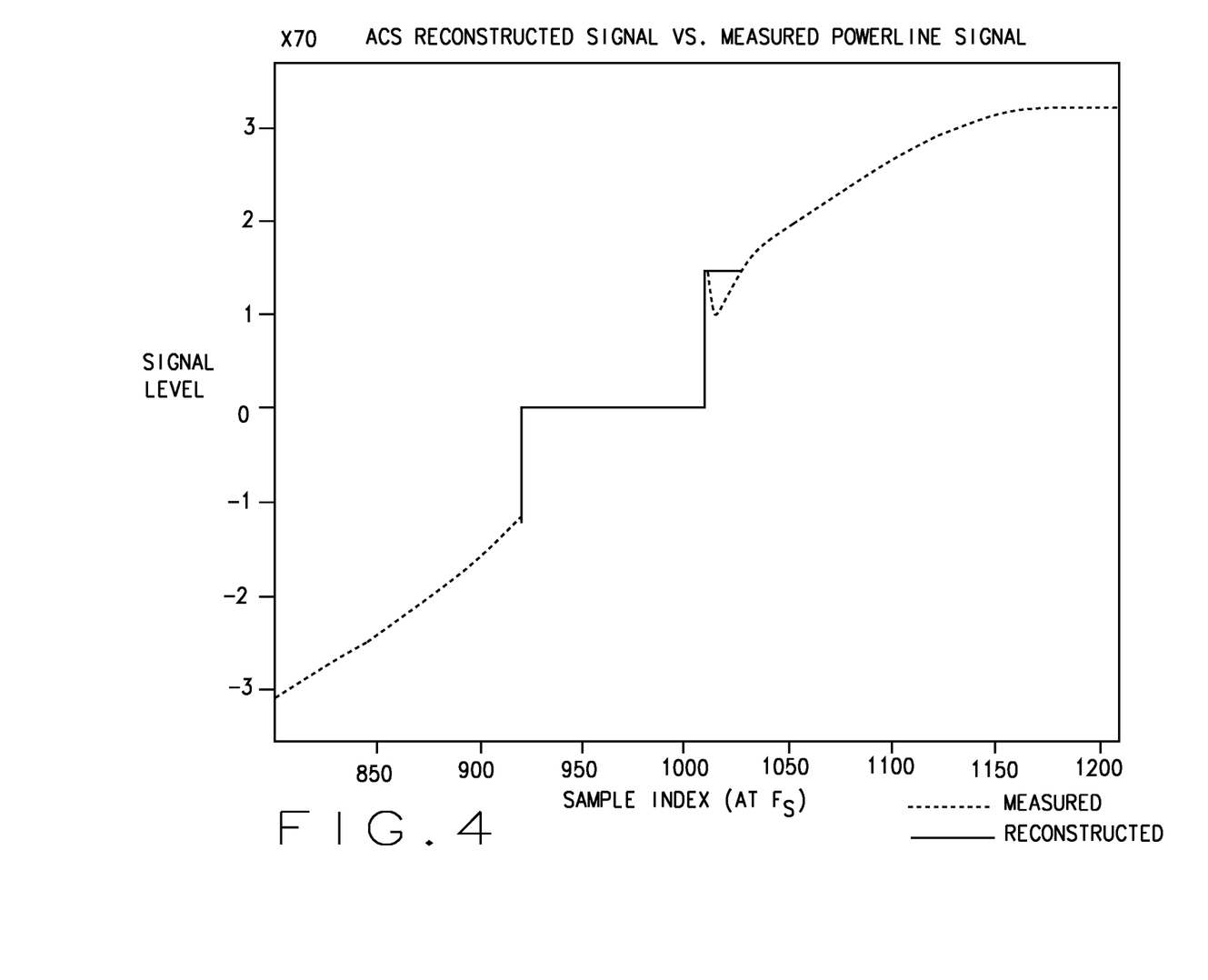
Figure 5:
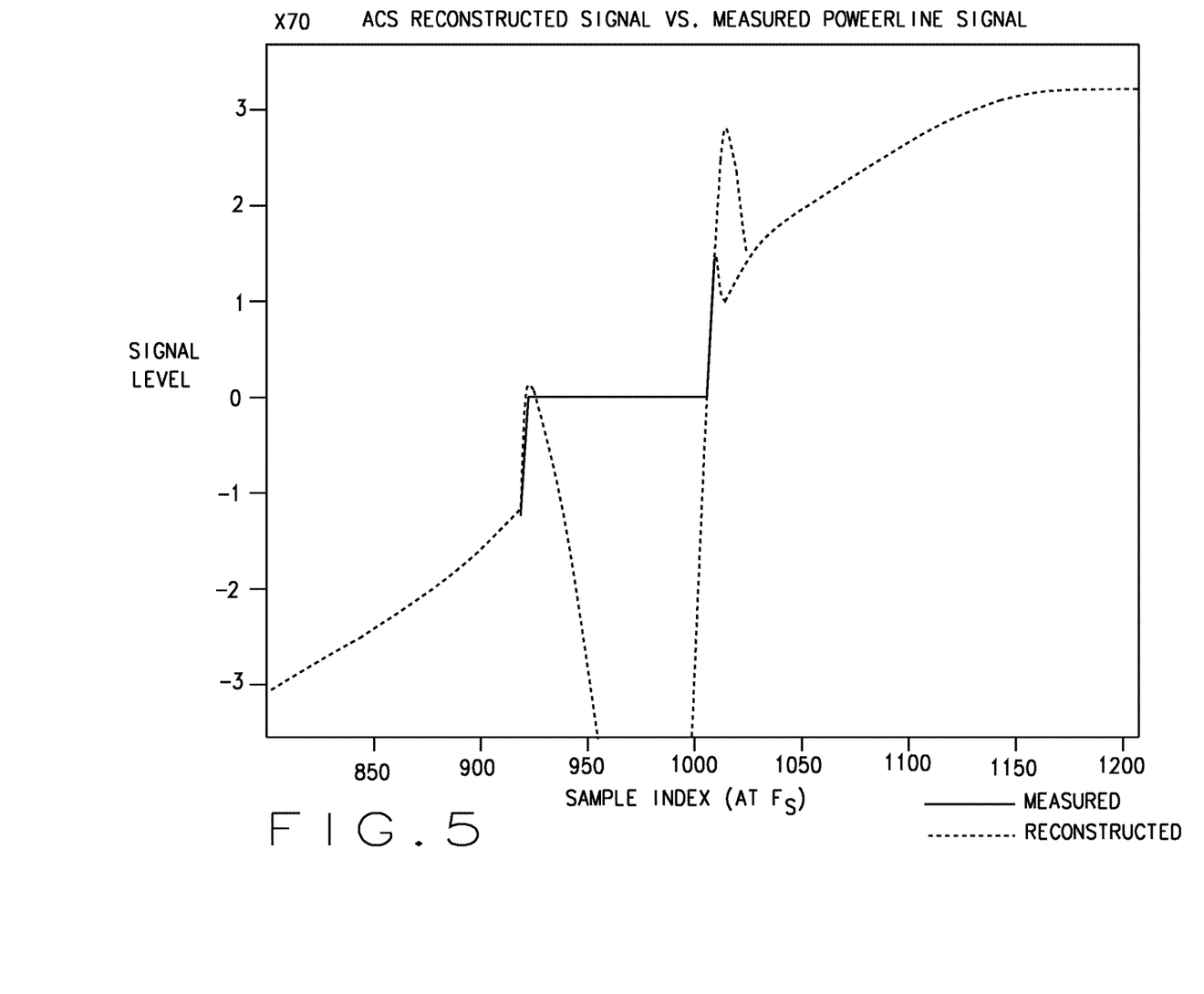

The second described embodiment requires an additional interpolation step in order to convert its "time versus level" output information to "level versus time" information. Interpolation techniques are well-known in the art, and may include polynomial interpolation (including linear interpolation), spline interpolation, sinc interpolation, trigonometric interpolation, filtering, as well as others. In a prototype of the preferred embodiment, linear interpolation and two forms of 3rd-order polynomial interpolation were investigated. A hybrid interpolation method, utilizing 3rd-order polynomials near the extremes of the powerline waveform and linear interpolation near the zero-crossings of powerline waveform WF, was shown to be very effective for maintaining the fidelity of the powerline waveform in the time domain. This is because for TWACS modulation near a transmitter, attenuation, filtering due to a line transfer function, and dispersion have not yet significantly affected or changed the 60 Hz powerline waveform WF in significant ways, as shown in FIG. 3. In FIG. 3, any sharp or significant changes in the waveform, near zero-crossings, are accommodated for using linear interpolation techniques. Those skilled in the art will understand that the more distant waveform WF propagates away from the transmitter, the less significant these effects become.

For maintaining a fine spectral content of powerline waveform WF in the frequency domain, linear interpolation alone was shown to be the most effective.

With linear interpolation, given two adjacent (time, level) data points, $(t_0,l_0)$ and $(t_1,l_1)$, a straight line that passes through both points is used to connect them. The equation for the straight line that passes through points $(t_0,l_0)$ and $(t_1,l_1)$ is determined as follows using a general two-point equation of the line, so that:

$$(y - y_0) = \frac{(y_1 - y_0)}{(x_1 - x_0)}(x - x_0).$$

Translated to notation used in the present invention:

$$(l - l_0) = \frac{l_1 - l_0}{t_1 - t_0}(t - t_0),$$

or $$l = l_0 + \frac{l_1 - l_0}{t_1 - t_0}(t - t_0).$$

The equation for 1 above is applied to each pair of (time, level) points, and calculated at any desired values for "t" (time) that lie between the pair. The "t" values are equally spaced at an appropriate sampling interval. In the preferred embodiment, the sampling interval is 1/37500 second or, in some instances, 1/50000 second.

Representations of this process are shown in FIGS. 4-9.

For the preferred embodiment prototype, two types of 3rd-order polynomial interpolations were investigated; Lagrange Interpolation, and Catmull-Rom Spline Interpolation. A Lagrange Interpolation is a standard practice and a specific 3rd-order implementation for the preferred embodiment of the invention is as follows.

Given four contiguous (time, level) data points, $(t_0,l_0)$, $(t_1,l_1)$, $(t_2,l_2)$, and $(t_3,l_3)$, there exists a unique 3rd-order polynomial that passes through all four points. Lagrange interpolation computes the value of that polynomial without needing to explicitly compute its coefficients:

$$l = \frac{(t-t_1)(t-t_2)(t-t_3)}{(t_0-t_1)(t_0-t_2)(t_0-t_3)}l_0 + \frac{(t-t_0)(t-t_2)(t-t_3)}{(t_1-t_0)(t_1-t_2)(t_1-t_3)}l_1 +$$
$$\frac{(t-t_0)(t-t_1)(t-t_3)}{(t_2-t_0)(t_2-t_1)(t_2-t_3)}l_2 + \frac{(t-t_0)(t-t_1)(t-t_2)}{(t_3-t_0)(t_3-t_1)(t_3-t_2)}l_3$$

In the preferred embodiment, the polynomial derived from points $(t_0,l_0)$, $(t_1,l_1)$, $(t_2,l_2)$, and $(t_3,l_3)$ is used only for the "t" (time) values that lie between the center pair of points, $(t_1,l_1)$ and $(t_2,l_2)$. Points $(t_0,l_0)$ and $(t_3,l_3)$ are used only to create the polynomial. After points between $(t_1,l_1)$ and $(t_2,l_2)$ are interpolated, the algorithm advances to the next interval where $(t_0,l_0)$, $(t_1,l_1)$, $(t_2,l_2)$, and $(t_3,l_3)$ are redefined accordingly. The "t" values are equally spaced at an appropriate sampling interval. In the preferred embodiment the sampling interval is 1/37500 second or, again in some instances, 1/50000 second.

Catmull-Rorn interpolation is also a standard technique which differs from Lagrange interpolation in that Catmull-Rom matches values at some points and slopes at some points; whereas, Lagrange interpolation matches only the values at all points. The specific 3rd-order implementation in the preferred embodiment is as follows:

Given four contiguous (time, level) data points, $(t_0,l_0)$, $(t_1,l_1)$, $(t_2,l_2)$, and $(t_3,l_3)$, there exists a unique 3rd-order polynomial that passes through $(t_1,l_1)$ and $(t_2,l_2)$ with a specified slope of the tangent at $(t_1,l_1)$ and an independently specified slope of the tangent at $(t_2,l_2)$.

Using, for example, Ferguson's Parametric Cubic Curves, given two control points $P_0$ and $P_1$, and the slopes of tangents $P'_0$ and $P'_1$ at each point, one can define a parametric cubic curve that passes through $P'_0$ and $P'_1$, with the respective slopes $P'_0$ and $P'_1$, by equating the coefficients of the polynomial function $$P(t) = a_0 + a_1 t - a_2 t^2 + a_3 t^3$$

with the values above, and with
$P(0) = a_0$
$P(1) = a_0 + a_1 + a_2 + a_3$
$P'(0) = a_1$
$P'(1) = a_1 + 2a_2 + 3a_3$ In the context of the present invention, $P(0) = (t_1,l_1)$ and $P(1) = (t_2,l_2)$. The issue then becomes one of finding $P'(0)$ and $P'(1)$. Catmull-Rom splines set the slope at $P(n)$ as a function of $P(n+1) - P(n-1)$, typically $$P'(n) = \frac{P(n+1) - P(n-1)}{2}$$

However, this assumes equally spaced data points which does not apply in the preferred embodiment. Instead, in the preferred embodiment the slope $P'(n)$ at point $P(n)$ is computed as the sum of the two adjacent slopes with each being weighted by the proximity of $P(n)$ to the control point on either side, $P(n-1)$ and $P(n+1)$; i.e., $$\frac{P(n) - P(n-1)}{t(n) - t(n-1)} \text{ and } \frac{P(n+1) - P(n)}{t(n+1) - t(n)},$$
and
$$P'(n) = \frac{t(n+l) - t(n)P(n) - P(n-l)}{t(n+l) - t(n-l)t(n) - t(n-l)} + \frac{t(n) - t(n-l)P(n+l) - P(n)}{t(n+l) - t(n-l)t(n+l) - t(n)}$$

In the context of the present invention, $P(-1) = (t_0,l_0)$ and $P(2) = (t_3,l_3)$.

Having found values for $P'(0)$ and $P'(1)$, an interpolation polynomial is determined and interpolated values at points "t" between $P(0)$ and $P(1)$, and equivalently between $(ti,l_1)$ and $(t_2,l_2)$, are computed.

Solving these equations, simultaneously, for $a_0$, $a_1$, $a_2$ and $a_3$, results in $a_0 = P(0)$ $a_1 = P'(0)$ $a_2 = 3[P(1) - P(0)] - 2P'(0) - P'(1)$ $a_3 = 2[P(0) - P(1)] + P'(0) + P'(1)$ Substituting these values into the original polynomial equation and simplifying the equation to isolate the terms with $P(0)$, $P(1)$, $P'(0)$, and $P'(1)$ produces $$P(t) = (1 - 3t^2 + 2t^3)P(0) + (3t^2 - 2t^3)P(1) + (t - 2t^2 + t^3)P'(0) + (-t^2 + t^3)P'(1)$$

which is in a cubic polynomial form. Alternatively, this can be written in a matrix form as $$P(u) = \begin{bmatrix} 1 & t & t^2 & t^3 \end{bmatrix} \begin{bmatrix} 1 & 0 & 0 & 0 \\ 0 & 0 & 1 & 0 \\ -3 & 3 & -2 & -1 \\ 2 & -2 & 1 & 1 \end{bmatrix} \begin{bmatrix} P(0) \\ P(1) \\ P'(0) \\ P'(1) \end{bmatrix}$$

After points between $(t_1,l_1)$ and $(t_2,l_2)$ are interpolated, the algorithm advances to the next interval, where $P(0)$, $P'(0)$, $P(1)$, and $P'(1)$ are redefined accordingly. The "t" values are equally spaced at an appropriate sampling interval. In the preferred embodiment this sampling interval is 1/37500 second or, in some instances, 1/50000 second.

In experiments with both polynomial interpolation methods, neither method was found to be consistently superior, so the choice of method is made according to the ease of implementation under the specific circumstances.

A hybrid approach used in a prototype of the preferred embodiment used linear interpolation preferably, but not necessarily, in the center half of the waveform, and 3rd-order polynomials preferably, but not necessarily, in the upper and lower quarters of a waveform WF. This allows the interpolation to follow any sharp transitions that may occur near the zero-crossings of the powerline waveform; while, also allowing the interpolation to reproduce the rounded extremes of the powerline waveform with reasonable fidelity.

With regard to performance, the detection circuitry in legacy TWACS meters such as shown in FIG. 2, includes a 1200 Hz lowpass filter LPF applied to the representation of the powerline waveform. It follows from this that the portion of the TWACS signal of interest lies predominantly in the region below 1200 Hz.

Spectral analysis of recorded powerline waveforms WF showed that a significant TWACS signature is attenuation of harmonic content at odd multiples of half the powerline frequency; that is, 30 Hz, 90 Hz, 150 Hz, etc., in a 60 Hz context. Spectral analysis of the same waveforms after passing through a computer simulation of the detection circuitry in legacy TWACS meters and reconstructed in accordance with the teachings of the present invention showed that linear interpolation performed significantly better than either form of 3rd-order polynomial interpolation at preserving this harmonic signature. In addition, linear interpolation proved better for extracting low-level non-TWACS communications' signals transmitted through the powerline, these signals being received at TWACS' meter locations and reconstructed in accordance with the teachings of the present invention. Any loss of fidelity can be attributed largely to the fact that the original waveform WF was captured with 24-bit ADCs; while, the waveform reconstructed by the present invention was limited to approximately 8-12 bit precision by the combination of the 8-bit DAC and the 1 MHz clock of the legacy TWACS system.

In deciding whether to employ the first or second embodiment of the invention, the first embodiment offers the ability to faithfully follow waveforms that are not monotonically increasing or decreasing. This is necessary if there are signals embedded in a powerline waveform WF as in, for example, powerline communications (PLC), or if there are high-frequency perturbations in the waveform that represent information. The resolution obtainable using the first embodiment is limited to the digital word size of a DAC, and the speed is limited by the combined delays and latencies of all of the elements in the signal chain.

The second embodiment allows for higher sampling frequencies and potentially higher effective resolution. But, this embodiment cannot follow waveforms that are not monotonically increasing or decreasing, so embedded signals or high-frequency perturbations cannot be captured.

In view of the above, it will be seen that the several objects and advantages of the present disclosure have been achieved and other advantageous results have been obtained.

The invention claimed is:

1. An electrical meter, the meter utilizing a two-way automatic communications system, the meter comprising:
a microprocessor;
a digital-to-analog converter (DAC);
a comparator;
a control module configured to receive a waveform from a utility power received at the electrical meter;
a clock; and
wherein the microprocessor, DAC, comparator, and clock are configured to function as an analog-to-digital converter (ADC) by which signal elements comprising the contents of a message are detected with sufficient fidelity; and
wherein the control module includes an automatic gain control (AGC) circuit configured to limit an input to the comparator such that the input to the comparator is within a range of values compatible with an output from the DAC;
wherein the DAC is configured such that a range of DAC output values is less than the input to the DAC for a respective positive and negative extreme value of the waveform.

2. The electric meter of claim 1, further comprising:
a filter coupled to an output of the AGC circuit, the output of the filter is provided as the input to the comparator, wherein the input is a voltage level; and
wherein when the DAC input is a minimum digital value, a first output from the DAC is greater than the output from the filter when the waveform is at a negative peak value; and wherein the DAC input is a maximum digital value, the value of a second output from the DAC is less than the output from the filter when the waveform is at a positive peak value.

3. The electric meter of claim 2, wherein the microprocessor outputs a digital word to the DAC, the digital word contains data corresponding to a target voltage level, a crossing of which by the waveform is to be detected;
wherein the DAC is configured to convert the word to a voltage level, and supply the voltage level to a reference input of the comparator, the comparator configured to compare the voltage level supplied from the filter against the reference voltage level supplied by the DAC and generate a first logic output in response to the voltage level input from the filter being greater than the reference level supplied by the DAC, and generate a second logic output in response to the voltage level input from the filter being less than the reference voltage level supplied by the DAC, wherein the first and second logic outputs represent the waveform crossing the target voltage level.

4. The electric meter of claim 3, wherein the meter further includes a clock and the microprocessor includes a counter whose count value increments in response to pulses received from the clock; and
wherein the microprocessor is configured to determine an elapsed time between target voltage level crossings by comparing counter values of the counter between target voltage level crossings.

5. The electric meter of claim 4 further including a heuristic algorithm applied by the microprocessor to the elapsed time value between crossings to detect the presence of message signal elements.

6. The electric meter of claim 5 further including performing a linear interpolation on the message signal elements for extracting and reconstructing communication signals transmitted through the powerline and received at the electric meter.

7. An electrical meter installed at a facility supplied electrical power by a utility's electrical distribution system, the meter utilizing a two-way communications system for receiving and processing messages sent from the utility to the facility over the electrical distribution system, the meter comprising:
a microprocessor;
a digital-to-analog converter (DAC);
a comparator;
a control module configured to receive a waveform from a utility power received at the an electrical meter;
a filter configured to provide an input to the comparator;
a clock;
an automatic gain control circuit (AGC); and
wherein the microprocessor, DAC, comparator, and clock are configured to function as an analog-to-digital converter (ADC) by which signal elements comprising the contents of a message are detected with sufficient fidelity; and
wherein the filter is coupled to an output of the AGC circuit; the AGC circuit configured to limit the output of the filter such that the input to the comparator from the filter is a voltage level that falls within a range of values compatible with an output from the DAC;
wherein the DAC is configured such that a range of DAC output values is less than the input to the DAC for a respective positive and negative extreme value of the waveform.

8. The meter of claim 7, wherein when the DAC input is a minimum digital value, a first output from the DAC is greater than the output from the filter when the waveform is at a negative peak value; and wherein the DAC input is a maximum digital value, the value of a second output from the DAC is less than the output from the filter when the waveform is at a positive peak value.

9. The meter of claim 8, wherein the microprocessor wherein the microprocessor outputs a digital word to the DAC, the digital word contains data corresponding to a target voltage level, a crossing of which by the waveform is to be detected;

wherein the DAC is configured to convert the word to a voltage level, and supply the voltage level to a reference input of the comparator, the comparator configured to compare the voltage level supplied from the filter against the reference voltage level supplied by the DAC and generate a first logic output in response to the voltage level input from the filter being greater than the reference level supplied by the DAC, and generate a second logic output in response to the voltage level input from the filter being less than the reference voltage level supplied by the DAC, wherein the first and second logic outputs represent the waveform crossing the target voltage level.

10. The electric meter of claim 9, wherein the meter further includes a clock and the microprocessor includes a counter whose count value increments in response to pulses received from the clock; and wherein the microprocessor is configured to determine an elapsed time between target voltage level crossings by comparing counter values of the counter between target voltage level crossings.

11. The improvement of claim 10 further including a heuristic algorithm applied by the microprocessor to the elapsed time value between crossings to detect the presence of message signal elements.

12. The electric meter of claim 11 further including performing a linear interpolation on the message signal elements for extracting and reconstructing communication signals transmitted through the powerline and received at the electric meter.

13. A method of detection of signal elements incorporated in an electrical waveform propagated through an electrical distribution system using a two-way communications system, the signal elements forming the contents of a message sent from the utility to a facility supplied electrical power by the utility through the electrical distribution system and received by an electrical meter installed at the facility, the method comprising:

configuring one or more components within the meter to function as an analog-to-digital (ADC) converter so to facilitate as an analog-to-digital (ADC) converter so to facilitate processing of the electrical waveforms by application of a signal based detection algorithm and improve detection of signal elements comprising a message thereby reducing the occurrence of a false synchronization with the signal elements for the content of a message to be reliably ascertained by the meter; wherein the components include a microprocessor, a digital-to-analog converter (DAC), a comparator, and a clock which, in combination, are configured to function as the ADC; and wherein the meter includes an automatic gain control (AGC) circuitry connected to a lowpass filter whose output is provided as an input to the comparator, the AGC ensuring that peak positive and negative extreme values of the waveform, as produced at an output of the filter, fall within a range compatible with an output from the DAC, and configuring the DAC such that its range of output values is less than the output values of the filter from the respective positive and negative extreme values of the waveform.

14. The method of claim 13, wherein when the DAC input is a minimum digital value, a first output from the DAC is greater than the output from the filter when the waveform is at a negative peak value; and wherein the DAC input is a maximum digital value, the value of a second output from the DAC is less than the output from the filter when the waveform is at a positive peak value.

15. The method of claim 14, further comprising:

selecting, by the microprocessor, a starting value for a digital word output supplied by the microprocessor as an input of the DAC;

converting, by the DAC, the digital word to a voltage level;

supplying, by the DAC, the voltage level to a reference input of the comparator;

comparing, at the comparator; the voltage level supplied from the filter against the reference voltage level supplied by the DAC;

generating, at the comparator, a first logic output in response to the voltage level input from the filter being greater than the reference level supplied by the DAC; and generating a second logic output in response to the voltage level input from the filter being less than the reference voltage level supplied by the DAC, wherein the first and second logic outputs represent the waveform crossing the target voltage level.

16. The method of claim 15 in which 1 counter value at each transition by the comparator represents time, and the input to the comparator from the output of the filter represents a voltage level, whereby for each transition a pair of values representing time versus level are generated, and the method further includes using a mathematical interpolation to convert the time versus level values to level versus time values so to produce a level versus time waveform to which signal-based analysis techniques are employed.

17. The method of claim 16 wherein the signal-based analysis techniques employed include one or more of:

polynomial interpolation including linear interpolation;
spline interpolation;
sinc interpolation;
trigonometric interpolation; and
filter.

18. The method of claim 17 further including performing an interpolation on processed powerline waveforms for extracting and reconstructing communication signals transmitted through the powerline and received at the meter location.

19. The method of claim 18 wherein the signal-based analysis techniques employed further include a hybrid interpolation utilizing $3^{rd}$-order polynomial interpolations near extreme values of the waveforms and linear interpolation near zero value crossings of the waveform.

20. The method of claim 17 in which the polynomial interpolation includes one or more of Lagrange interpolation and Catmull-Rom spline interpolation ad linear interpolation.

* * * * *